(12) United States Patent
Geist

(10) Patent No.: US 6,362,672 B1
(45) Date of Patent: Mar. 26, 2002

(54) APPARATUS AND METHOD FOR AUTOMATIC MATCHING OF SIGNALING RISE TIME TO FALL TIME

(75) Inventor: Alan S. Geist, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/778,771

(22) Filed: Feb. 8, 2001

(51) Int. Cl.$^7$ ................................................. H03K 5/12
(52) U.S. Cl. ........................................ 327/170; 327/266
(58) Field of Search .................................. 327/170, 171, 327/172, 176, 13, 14, 15, 24, 263, 266, 361

(56) References Cited

U.S. PATENT DOCUMENTS

| | | | | |
|---|---|---|---|---|
| 5,083,049 A | * | 1/1992 | Kagey | 327/141 |
| 5,134,308 A | * | 7/1992 | Boemi | 327/170 |
| 5,764,091 A | * | 6/1998 | Sumita et al. | 327/175 |
| 5,852,378 A | * | 12/1998 | Keeth | 327/171 |
| 6,111,447 A | * | 8/2000 | Ternullo, Jr. | 327/292 |
| 6,222,422 B1 | * | 4/2001 | Opris | 331/25 |

* cited by examiner

Primary Examiner—Timothy P. Callahan
Assistant Examiner—Hai L. Nguyen
(74) Attorney, Agent, or Firm—Antonelli, Terry, Stout & Kraus, LLP

(57) ABSTRACT

A method and apparatus for matching rise time and fall time in two differential signals. The apparatus includes a system that includes an scaled summer, a reference voltage generator, a comparator, and a storage device. The scaled summer receives two input signals and generates an instantaneous scaled sum of the two input signals. The reference voltage generator generating a reference voltage. The comparator compares the scaled summer output signal and the reference voltage and generates a comparison signal. The storage device stores the comparison signal. The stored comparison signal is usable to adjust one of the rise time and the fall time of both of the two input signals to match one of the fall time and the rise time of the two input signals.

28 Claims, 6 Drawing Sheets

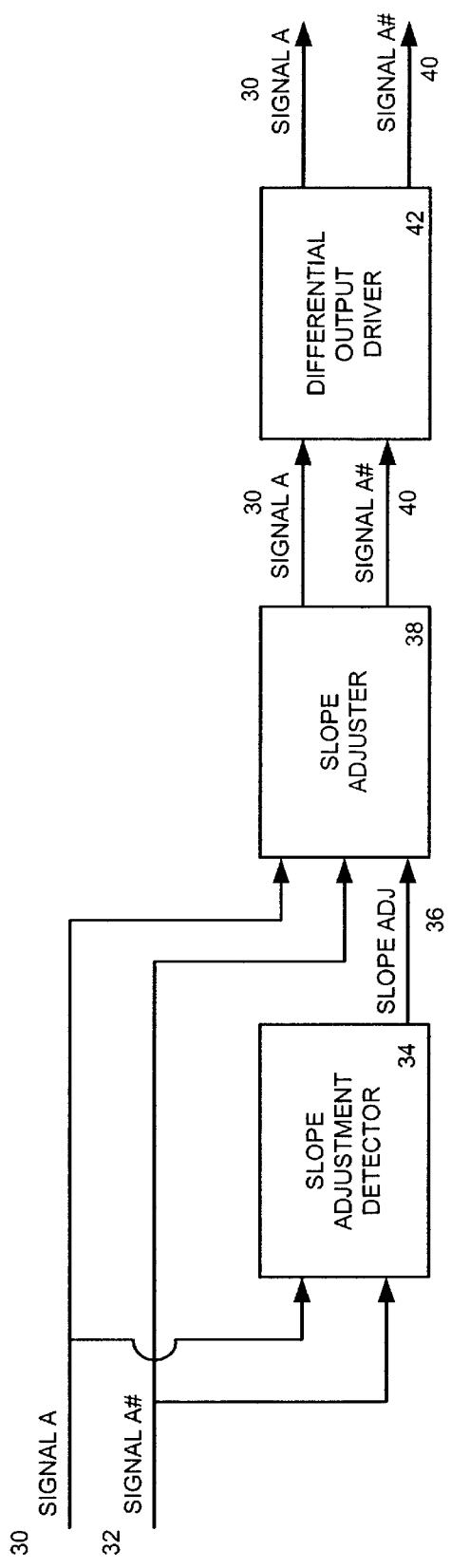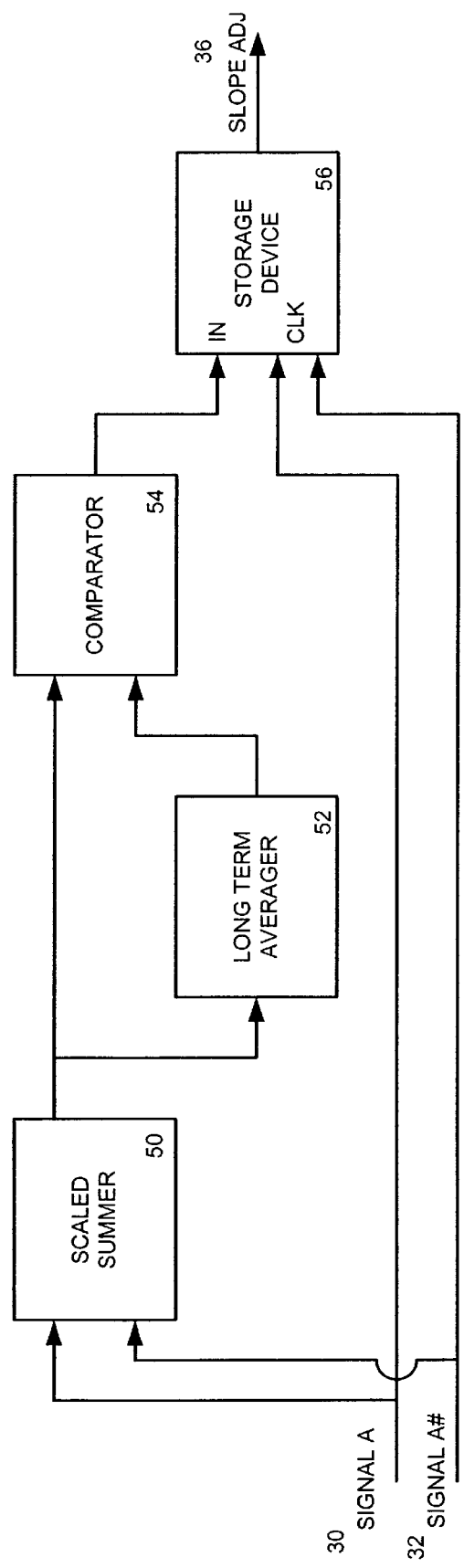
FIG. 3
FIG. 4

APPARATUS AND METHOD FOR AUTOMATIC MATCHING OF SIGNALING RISE TIME TO FALL TIME

BACKGROUND

1. Field

This invention relates to differential signals, and more specifically to matching the rise and fall times of differential signals.

2. Background

Differential signaling methods are becoming increasingly common in high speed digital systems. This is primarily due to the superior timing performance and noise rejection produced using differential signaling methods. However, these advantages do not come without risk. In the effort to produce very high speed differential input circuits, common mode crossing voltage range is often sacrificed. Common mode crossing voltage range is the absolute voltage range over which two differential signals are allowed to cross.

In these cases, having output drivers that produce differential signals that fall and rise at very equal rates helps guarantee that the differential signals cross at a midpoint between a stable high and a stable low state. The problem of differential signals not crossing at the midpoint can become especially detrimental in signaling technologies that appear characteristically unbalanced to the output drivers, e.g., tri-state signaling technologies (e.g., Gunning Transceiver Logic (GTL)). GTL switching (and other tri-state technologies) makes use of pull-up resistors on every signal line, but no pull-down resistors, resulting in an unbalance load to the drivers.

In signaling that has a pull-up but no pull-down, when the driver is pulling the signal line down, this goes against the pull-up resistor which is pulling the signal line up. This, therefore, retards the falling edge (i.e., slowing down) of the signal. When a driver output is driving high, the pull-up helps pull the signal line high thus creating a faster rising edge. When the rising edge of one differential signal does not match the falling edge of the other, an off center crossing voltage results. Input amplifiers are most sensitive at a centered crossing voltage and, therefore, when the crossing voltage is at or near the center of the falling edge of one signal and the rising edge of the other, the system runs cleaner and faster.

Varying the bias on output pre-drivers is a technique that has been used for years to loosely control rise and fall times. However, currently there is no system or method that uses any kind of feedback system to control this bias to make edge rates match. That is, currently there is no circuit that matches rising edge and falling edges so that the signals cross as close to the center as possible.

Therefore, there is a need to provide a system and method to guarantee that rise time matches fall time to within a small area, even in spite of unbalance lines, by providing a control signal that tells whether a particular edge should be accelerated or decelerated.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein:

FIG. 3 is a block diagram of an example system for matching rise and fall times according to an example embodiment of the present invention;

FIG. 4 is a block diagram of an example slope adjustment detector according to an example embodiment of the present invention;

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments (e.g., servers).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to apparatus and methods for matching rise time to fall time that takes advantage of the concept that the sum of two differential signals is a constant. Ideal true differential digital signals are always either at opposite stable states, or are transitioning between states in opposite directions. The sum of these two signals is a flat line. The present invention takes advantage of this concept to provide a feedback system which provides a control signal that may be used by slope control circuitry, (e.g., pre-driver bias adjusting circuit), to accelerate or decelerate an edge of one of the differential signals to match the edge of the other.

Figure 1:
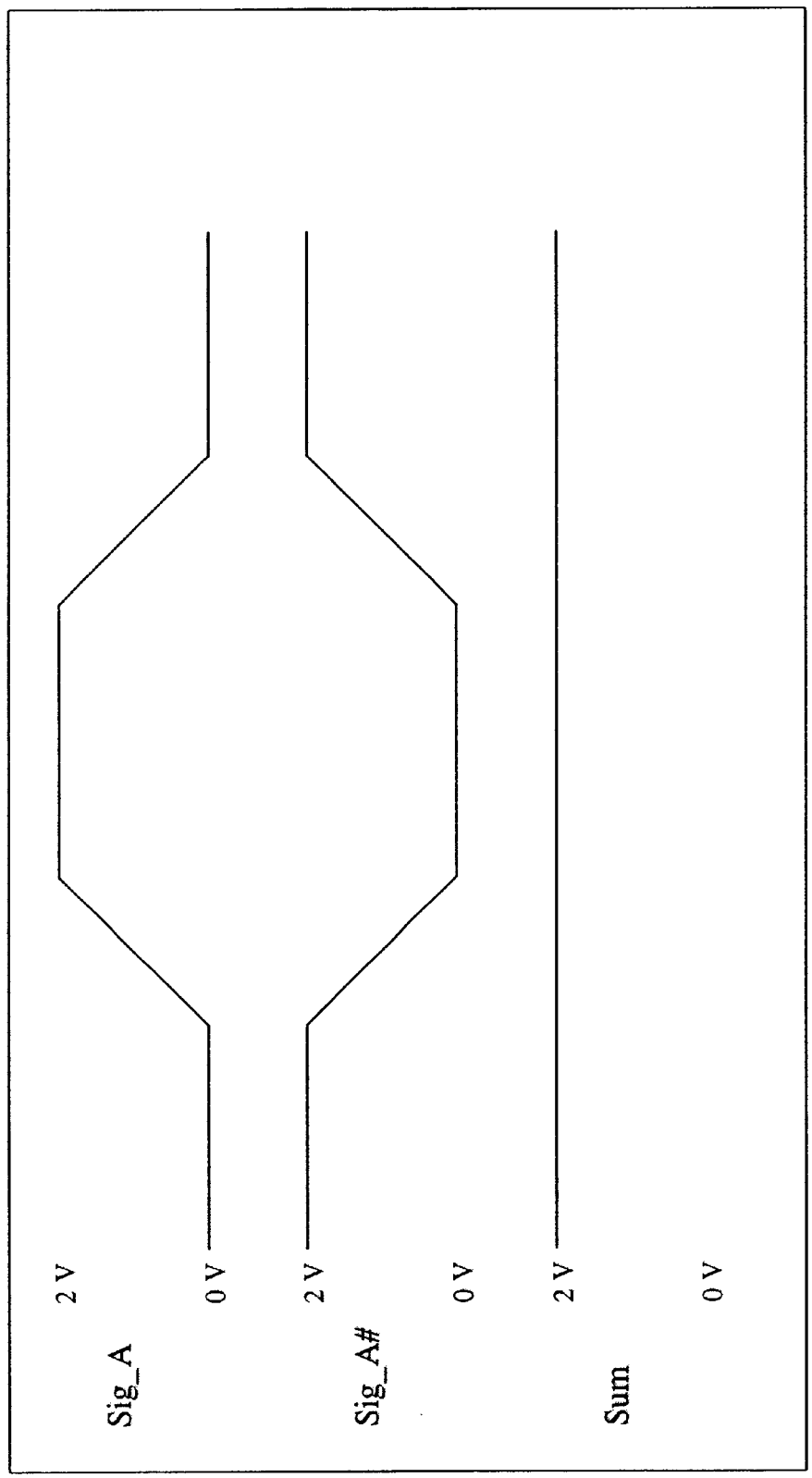
FIG. 1 is a timing diagram of example ideal differential signals and their sum.

FIG. 1 shows a timing diagram of example ideal differential signals and their sum. In this example embodiment, signal A (Sig_A) and signal A# (Sig_A#) have a common mode voltage range of between 0 and 2 volts. As signal A transitions from 0 volts to +2 volts, signal A# transitions from +2 volts down to 0 volts. Similarly, as signal A transitions from +2 volts down to 0 volts, signal A# transitions from 0 volts up to +2 volts. The crossing voltage for these differential signals is at or very near the mid point of the transitioning slopes, i.e., around 1 volt. In this ideal differential signal situation, the sum of these differential signals is a constant, in this case at 2 volts. In reality, the sum of two differential signals is not perfectly flat.

Figure 2:
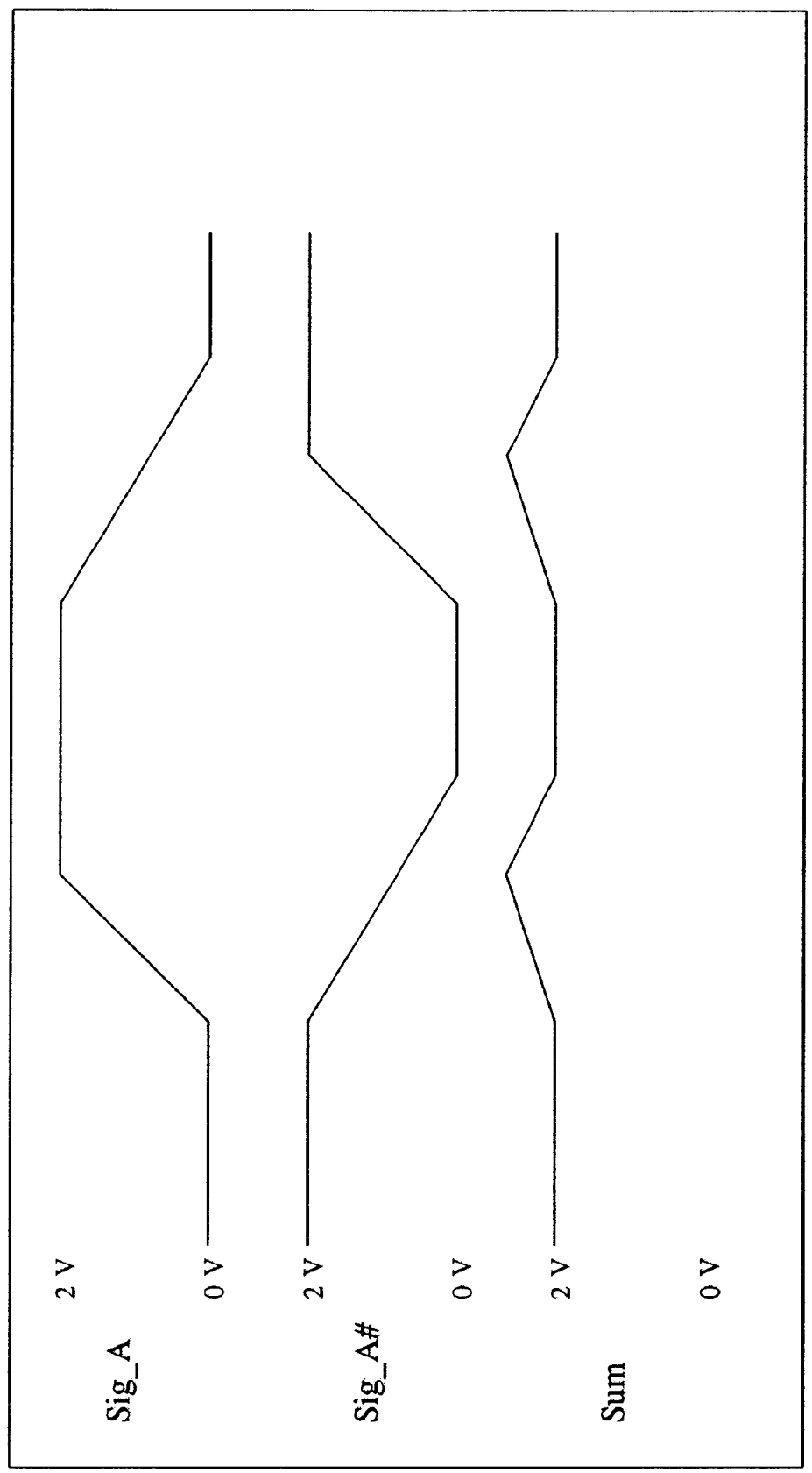
FIG. 2 is a timing diagram of example non-ideal differential signals and their sum.

FIG. 2 shows a timing diagram of example non-ideal differential signals and their sum. Differential signals in which the fall time is slower than the rise time have a period of time during transition in which the sum of the two signals rises above the otherwise constant value. The opposite holds true for differential pair signals in which the rise time is slower than the fall time. As shown in FIG. 2, the rise time of signal A is faster than the fall time of signal A#. This results in the sum of the two differential signals not being a constant, but having a slight peak between the common mode crossing voltage range. Similarly, as can be seen in FIG. 2, the rise time of signal A# is faster than the fall time of signal A, also resulting in a non-constant sum in the form of a slight peak between the common mode crossing voltage range. Therefore, when the rising edges don't match the falling edges, this produces an off-center crossing voltage and, therefore, the sum of the two differential signals is no longer a constant. Apparatus and methods according to the present invention uses this fact to generate a control signal that may be used to adjust the bias of one of the differential signals such that the rising edge of one signal and the falling edge of the other signal match and produce a crossing voltage that is as close to the center as possible.

FIG. 3 shows a block diagram of an example system for matching rise and fall times according to an example embodiment of the present invention. This example embodiment includes a slope adjustment detector 34, a slope adjuster 38, and a differential signal output driver 42. The system receives differential pair signals signal A, 30, and signal A#, 32, whereby signal A, 30, and signal A#, 32, have rise times and/or fall times that may not match each other. The system in FIG. 3 receives the differential pair signals, determines if slope adjustment is necessary, adjusts the slope of one of the signals to match the slope of the other, and produces output signals from differential output driver 42 (signal A, 30 and signal A#, 40), whereby signal A# 40 has had a slope adjustment on one of its edges to match the slope of a corresponding edge of signal A, 30 as close as possible.

For example, the slope of fall time of signal A# 32, is adjusted to produce signal A# 40, that closely matches the rise of signal A, 30. Slope adjustment detector 34 receives both differential signals, and determines if the slope of the fall time of signal A# 32 requires adjustment. If adjustment is required, slope adjustment detector 34 signals this fact to slope adjuster 38 by a slope adjustment signal 36. Slope adjuster 38 uses slope adjustment signal 36 to determine which direction to adjust signal A# 32. Slope adjuster 38 adjusts signal A# 32 appropriately such that the fall time of signal A# 32 closely matches the rise time of signal A 30, thereby producing signal A# 40.

Signals A, 30, and signal A# 40 (the adjusted signal) are then sent to differential output driver 42 where they may be transmitted to a differential receiver. This system may be resident on an integrated circuit (IC) that is an output driver integrated circuit, or any other type of IC. Therefore, the output driver integrated circuit receives two differential signals whereby the rise time and the fall time may not match, corrects this situation (if they do not match), and transmits the two signals whereby the rise time and fall time are closely matched. This is helpful to a receiver of these differential signals in that input amplifiers are most sensitive at centered crossing voltages. This allows the entire system to run cleaner and faster.

Although the present invention has been illustrated by discussing the system in FIG. 3 adjusting the falling edge of both signals to match the rising edge of the same signals, the reverse is also possible and still be within the spirit and scope of the present invention (i.e., adjusting the rising edges to match the falling edges). Further, the system shown in FIG. 3 may be discrete circuitry on a mother board or other electronic device, wholly integrated into an IC as mentioned previously, or just a portion of logic that resides on an integrated circuit that serves a much larger function than merely an output driver IC.

FIG. 4 shows a block diagram of an example slope adjustment detector according to an example embodiment of the present invention. The slope adjustment detector 34 shown in FIG. 4 includes an scaled summer 50 that sends an instantaneous scaled sum of differential signals 30 and 32 to a long term averager 52, and to a first input of a comparator 54. Long term averager 52 sends a long term average of the instantaneous scaled sum signal to a second input of comparator 54. The output of comparator 54 is sent to the input of a storage device 56 whereby it is clocked into storage device 56 to generate slope adjustment signal 36. As noted previously, slope adjustment signal 36 may be used by a slope adjuster to determine which direction to adjust one or the other of the differential signals. Scaled summer 50 may include any type device or circuit that performs this function such as a summing circuit, an instantaneous averager, etc. and still be within the spirit and scope of the present invention.

Scaled summer 50 receives the differential pair signals, signal A, 30, and signal A# 32. Scaled summer 50 receives these two signals and computes an instantaneous scaled sum of the two signals. This instantaneous scaled sum may be sent to comparator 54. The instantaneous scaled sum may also be sent to long term averager 52. Long term averager 52 computes a long term average of signal A 30 and signal A# 32. The long term average computed by long term averager 52 may then be sent to comparator 54. Comparator 54 compares the instantaneous scaled sum with the long term average, and sends the result of this comparison to storage device 56 to be captured. If a falling edge is faster than a rising edge, then the instantaneous scaled sum may be slightly less than the long term average. In contrast, if a rising edge is faster than the falling edge, the instantaneous scaled sum may be slightly higher than the long term average.

To illustrate the present invention, it is assumed that the rise time of both signals have been fixed and that the fall time of both signals is adjusted to match the rise time, or that the fall time is fixed and the rise time may be adjusted to match the fall time. Therefore, if the fall time is longer than the rise time (as is shown in FIG. 2), then storage device 56 may capture a "high" signal and the output slope adjustment signal 36 may be used to instruct slope adjuster 38 (e.g., a pre-driver bias circuit) to adjust the slew rate on the falling edges (e.g., decrease the fall time). In contrast, if the fall time is shorter than the rise time, then the input signal at the first input of comparator 54 may drop briefly, therefore, causing a signal to received by storage device 56 that may instruct slope adjuster 38 to increment the fall time (reduce the slew rate). In apparatus and methods for matching rise and fall time according to the present invention, an instantaneous scaled sum and a long term average may be captured once every rising edge (e.g., once every other crossing) or more accurately be measured every rising edge and every falling edge (i.e., at every crossing).

Figure 5:
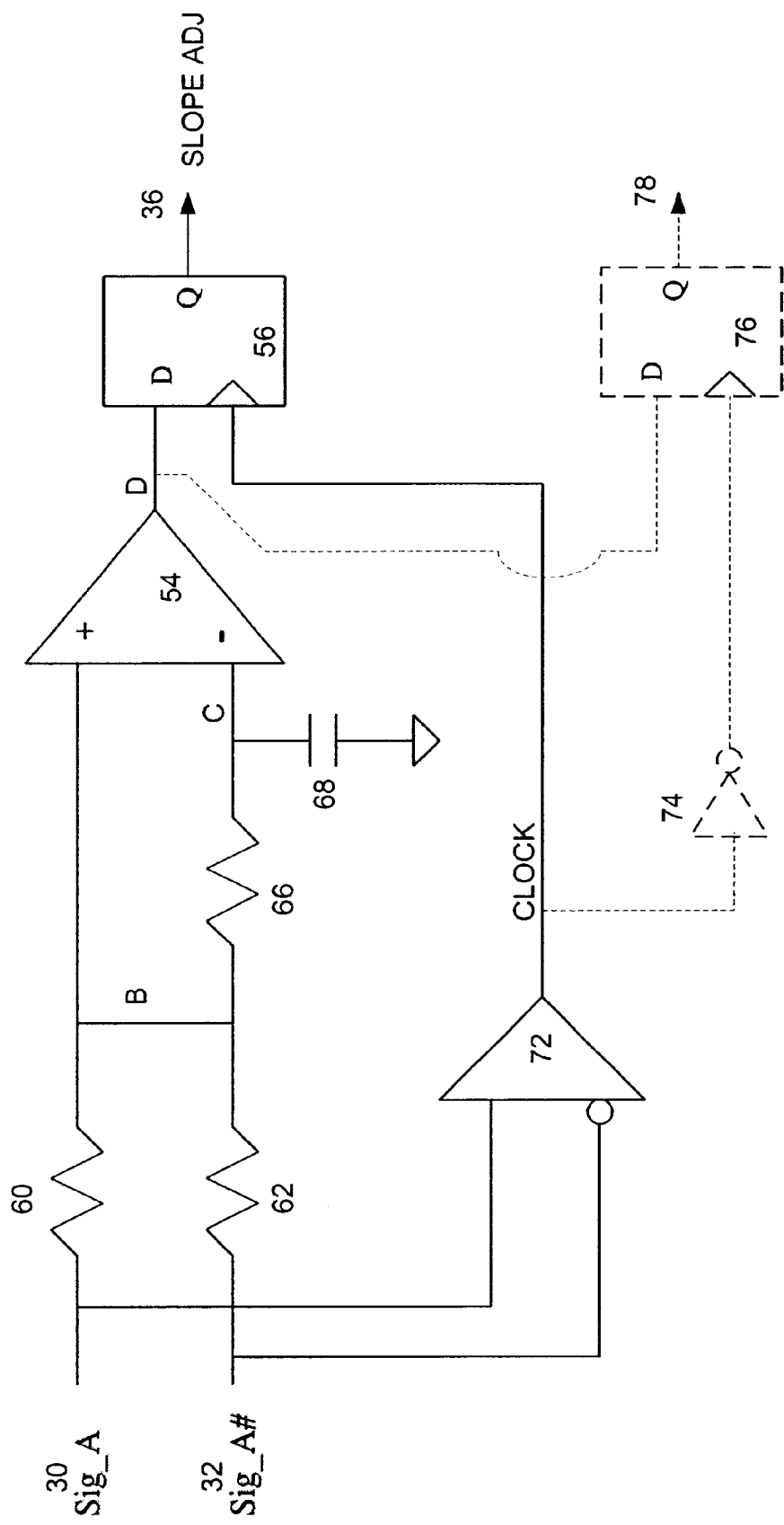
FIG. 5 is a schematic diagram of an example implementation of a slope adjustment detector according to an example embodiment of the present invention.

FIG. 5 shows a schematic diagram of an example implementation of slope adjustment detector shown in FIG. 4. Resistors 60 and 62 receive differential signals Sig__A 30 and Sig__A# 32, respectively. Resistor 60 and 62 are connected at point B. These two devices form an example scaled summer 50, as shown in FIG. 4. The output of the scaled summer (point B) may then be fed to a non-inverting input of an operational amplifier 54. Operational amplifier 54 is an example comparator. A differential amplifier may also serve as a comparator (as may other devices that perform a comparison function on its inputs). The output of the scaled summer (point B) may also be fed to resistor 66 which is connected to a capacitor 68. Resistor 66 and capacitor 68 are connected at point C and produce a long term average of the signal at point B. Resistor 66 and capacitor 68 form an example long term averager 52.

The output of the long term averager, point C, may be connected to the inverting input of an operational amplifier 54. The output of the scaled summer, point B, may be connected to the non-inverting input of operational amplifier 54. The output of operational amplifier 54, point D, may be connected to the input of a storage device 56, which in this example embodiment is a D flip-flop. The output of operational amplifier 54 may be clocked into flip-flop 56 by a clock formed from the output of differential receiver 72. Differential receiver 72 receives differential signals Sig__A 30 and Sig__A# 32. This insures that the comparison between the instantaneous scaled sum and the long term average (e.g., signal at point D), is captured when the two input differential signals (Sig__A 30 and Sig__A# 32) are changing. The output of flip-flop 56 produces slope adjustment signal 36.

Flip-flop 56 captures a comparison of the scaled sum and long term average once every rising edge of Sig__A, 30 (i.e., once every other crossing). However, measurements may be taken every rising edge and every falling edge of Sig. A, 30. This is accomplished by adding another storage device or flip-flop, 76, that may receive the same signal at point D as an input, but is clocked with the invert of the clock output from differential receiver 72. Inverter 74 inverts the clock signal from differential receiver 72 and generates another clock that is used to capture the comparison signal at point D. An output signal 78 from flip-flop 76 represents the slope adjustment needed for adjusting signal A#"s rising edge to the falling edge of signal A, 30. Therefore, according to the present invention, slope adjustments may be determined on the rising edge of one of a pair of differential signals or on the falling edge of the one differential signal, or on both the rising and falling edge.

Figure 6:
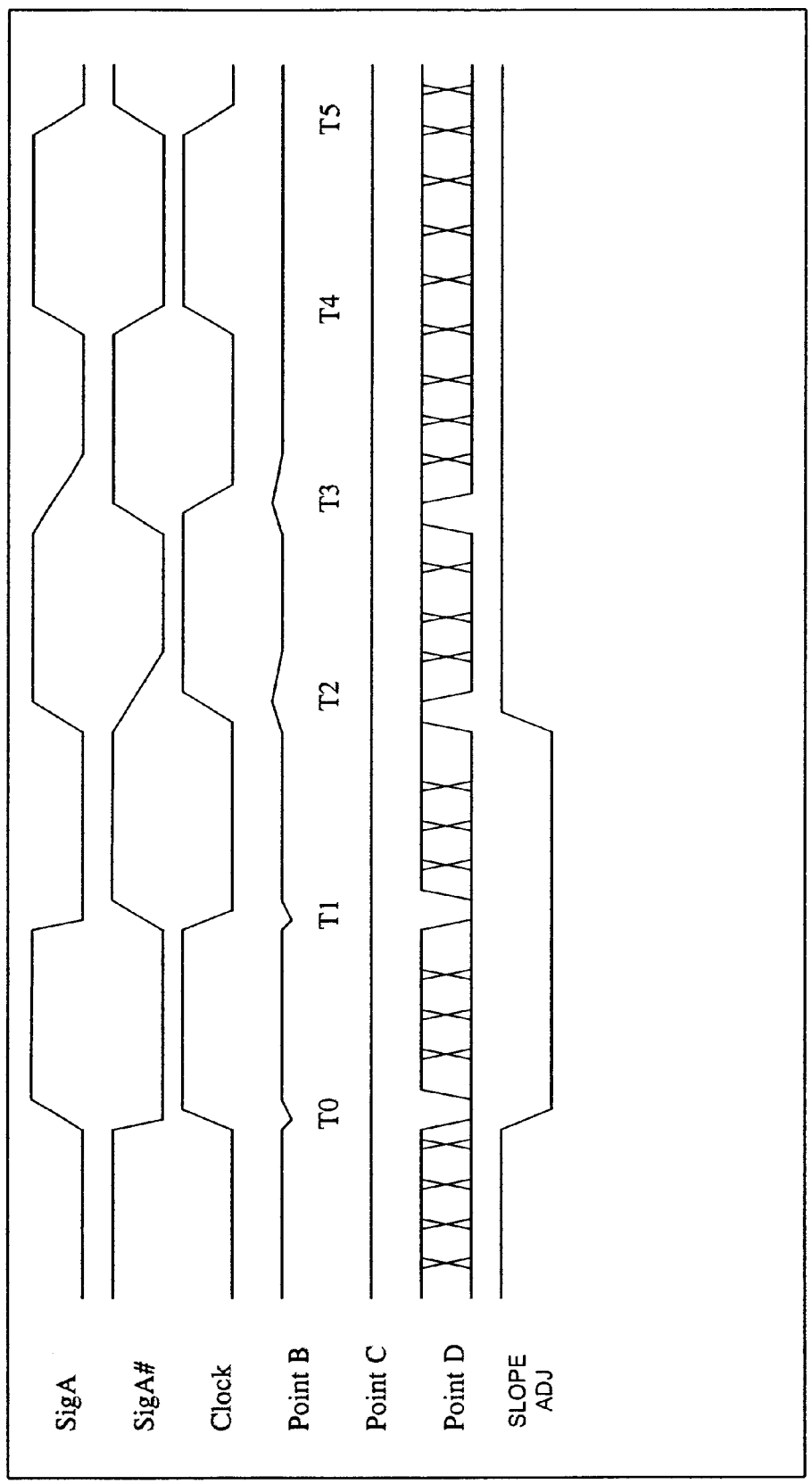
FIG. 6 is a timing diagram of example timing for matching rise and fall times according to an example embodiment of the present invention.

FIG. 6 is a timing diagram of example timing for matching rise and fall times according to an example embodiment of the present invention. The timing diagram shows signal A, signal A#, the clock from differential receiver 72, the signal at point B (i.e., the instantaneous scaled sum), the signal at point C (i.e., the long term average), the signal at point D (output of operational amplifier 54, i.e., comparison of signals at point C and point D), and the slope adjustment signal 36 that may be used by a slope adjuster to adjust the falling edge of signals A and A# to the rising edge of signals A and A#.

If the fall time is shorter than the rise time, as shown in FIG. 6 at time T0 and T1, then flip-flop 56 may capture a low signal, and output slope adjustment signal 36 may instruct a slope adjuster (e.g., pre-driver bias circuit), to decrease the slew rate on the falling edges (i.e., increase the fall time). In contrast, if the fall time is longer than the rise time, as is shown at time points T2 and T3 in FIG. 6, then the instantaneous sum signal at point B may rise briefly, and the output slope adjustment signal 36 may instruct a slope adjuster to decrement the fall time (i.e., increase the slew rate). If the signals at points B and C are too close for operational amplifier comparator 54 to resolve, as is shown at times T4 and T5, then the output of flip-flop 56 may be indeterminate. Thus, it is desirable that storage device 56, or a slope adjuster receiving the output from storage device 56, be meta stable resistant or meta stable tolerant. However, since it is presumed that edge rate adjustments are small, as is the nature of all negative feedback loops, a small oscillation of the control variable (in this example, slew rate of falling edges) is inevitable and may be very tolerable. In other words, the slew rate may rise until it is slightly too high, fall until it is slightly too slow, then repeat. However, at all times the slew rate may be very close to ideal.

In another embodiment of the present invention, the low pass filter (resistor 66 and capacitor 68 in FIG. 5) that performs long term averaging, may be replaced with a sample and hold circuit, or track and hold circuit. In this example embodiment, situations wherein the differential input signals go tri-state and possibly float to the same digital state may be accommodated. In bi-directional tri-state (e.g., GTL) differential signals, when signal switch over occurs (i.e., device A driving to device B on a signal line, then switching over where device B drives to device A on the same signal line), there is a switchover time where all outputs may be off. During this time, both signals may float to a logic "high" due to pull-up resistors attached to the tri-state signal lines. Therefore, the two differential signals are non-differential signals for a period of time. By turning on a sample and hold or track and hold circuit only when the signals are truly differential and being driven by the drivers which are being controlled by the side supplying the differential signals, times in which there may be potential problems are filtered out. Thus, the long term average of the sum of the two differential signals is not affected during transitional switchover times or times when the drivers being controlled are turned off in systems using bi-directional differential signals.

Moreover, since the present invention may be implemented on an integrated circuit, motherboard, etc., no additional pins are required on the integrated circuit or mother board since all input signals are likely already available on the integrated circuit or motherboard. Depending on the value required for capacitive device 68, this device may need to be provided exterior to an integrated circuit which may necessitate one or more pins.

Further, if the signaling technology used involves transmission line reflections, vigorous implementations of the present invention for each signal line may be impractical. In these cases, a dummy differential driver driving two dedicated pins which then connect to two matched transmission lines, which then may feedback into the integrated circuit through two more dedicated pens, may be used. In this example embodiment, it is assumed that the dummy drivers' characteristics match those of the real drivers, and the slope adjuster for the dummy may be used for all drivers. Further, the characteristics of the external dummy transmission lines should also match those of the real signals. Therefore, by using a dummy differential driver with rise and fall time matching, the matching may be determined on signal lines that are not a part of the operational system, and the adjustments determined from the dummy driver used on appropriate system differential signal lines. This is advantageous in that each operational system differential signal line need not be connected to rise and fall time matching determination circuitry.

Figure 7:
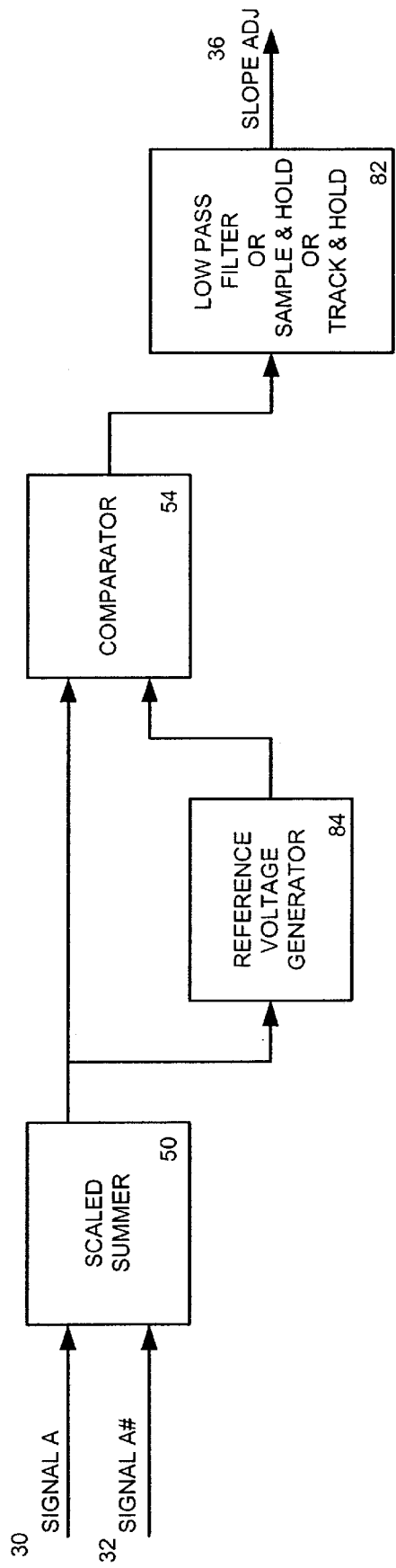
FIG. 7 is a block diagram of an example slope adjustment detector according to another example embodiment of the present invention.

FIG. 7 is a block diagram of an example slope adjustment detector according to another example embodiment of the present invention. In this embodiment, storage device 56 in FIG. 4 is replaced with an analog device 82 such as a low pass filter, a sample and hold device/circuit, or a track and hold device/circuit, and long term averager 52 is replaced with a reference voltage generator 84. Although analog device 82 is shown in FIG. 7 as being a low pass filter, a sample and hold device/circuit, a track and hold device/circuit, or any analog device and/or circuit that provides a holding or storage function may be used and still be within the spirit and scope of the present invention.

Reference voltage generator 84 may be any acceptable reference voltage source, including but not limited to a long term averager, a resistor voltage divider, a zener diode reference, etc. The method used to develop the reference and the value of the reference may depend on the particular application of the present invention. The reference voltage generator 84 may or may not make use of the output of scaled summer 50.

Reference voltage generator 84 may be biased above or below the voltage that a long term averager provides, if the designer finds it advantageous to have the crossing point of the differential signals A and A# off center. For example, if the input amplifiers being used as receivers are most sensitive at some point above (or below) the halfway point between logic high and logic low, then a reference voltage above (or below) the halfway point may specifically induce the desired effect.

It is noted that the foregoing examples have been provided merely for the purpose of explanation and are in no way to be construed as limiting of the present invention. While the present invention has been described with reference to a preferred embodiment, it is understood that the words which have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A system for matching rise time and fall time in two signals comprising:
    an scaled summer, the scaled summer receiving two input signals and generating an instantaneous scaled sum signal;
    a reference voltage generator, the reference voltage generator receiving the scaled sum signal for generating a reference voltage;
    a comparator, the comparator comparing the scaled sum signal and the reference voltage and generating a comparison signal; and
    a storage device, the storage device storing the comparison signal based on the two input signals, the stored comparison signal usable by a controller to adjust one of the rise time and the fall time of both of the two input signals to match one of the fall time and the rise time of the two input signals.

2. The system according to claim 1, wherein the storage device comprises at least one of a buffer, a flip flop, a logic gate, and a register.

3. The system according to claim 1, wherein the scaled summer comprises one of a summing circuit and an instantaneous averager.

4. The system according to claim 3, wherein the summing circuit comprises two impedance devices connected together, one of the two impedance devices receiving one of the two input signals, the other of the two impedance devices receiving the other of the two input signals.

5. The system according to claim 4, wherein the impedance devices comprise resistors.

6. The system according to claim 1, wherein the reference voltage generator comprises one of a long term averager, a resistor voltage divider, and a zener diode reference.

7. The system according to claim 6, wherein the long term averager comprises one of at least one transistor, at least one operational amplifier, at least one resistive device connected to at least one capacitive device, a low pass filter, a sample and hold circuit, and a track and hold circuit.

8. The system according to claim 1, wherein the comparator comprises one of an operational amplifier and a differential amplifier.

9. The system according to claim 1, wherein the storage device receives a clock signal, the comparison signal being stored based on a rising edge of the clock signal.

10. The system according to claim 9, further comprising a second storage device, the second storage device receiving an inversion of the clock signal, the second storage device storing the comparison signal based on a rising edge of the inverted clock signal, the second stored comparison signal usable by the controller to adjust one of the rise time and the fall time of both of the two input signals to match one of the fall time and the rise time of the two input signals.

11. A method for matching rise time and fall time in two signals comprising:
    generating an instantaneous scaled sum signal of two input signals;
    generating a reference voltage using the scaled sum signal;
    comparing the scaled sum signal and the reference voltage and generating a comparison signal; and
    storing the comparison signal based on the two input signals the stored comparison signal usable by a controller to adjust one of the rise time and the fall time of both of the two input signals to match one of the fall time and the rise time of the two input signals.

12. The method according to claim 11, further comprising receiving a clock signal, the comparison signal being stored based on a rising edge of the clock signal.

13. The method according to claim 12, further comprising receiving an inversion of the clock signal, the comparison signal being stored based on a rising edge of the inverted clock signal, the second stored comparison signal usable by the controller to adjust one of the rise time and the fall time of both of the two input signals to match one of the fall time and the rise time of the two input signals.

14. An Integrated Circuit (IC) comprising:
    an scaled summer, the scaled summer receiving two input signals and generating an instantaneous scaled sum signal;

a reference voltage generator, the reference voltage generator receiving the scaled sum signal for generating a reference voltage;

a comparator, the comparator comparing the scaled sum signal and the reference voltage and generating a comparison signal; and a storage device, the storage device storing the comparison signal based on the two input signals;

a slew rate controller, the slew rate controller using the stored comparison signal to adjust one of the rise time and the fall time of both of the two input signals to match one of the fall time and the rise time of the two input signals generating two matching signals; and an output driver, the output driver receiving the two matching signals from the slew rate controller and driving the two matching signals.

15. The IC according to claim 14, wherein the storage device comprises at least one of a buffer, a flip flop, a logic gate, and a register.

16. The IC according to claim 14, wherein the scaled summer comprises a summing circuit.

17. The IC according to claim 16, wherein the summing circuit comprises two impedance devices connected together, one of the two impedance devices receiving one of the two input signals, the other of the two impedance devices receiving the other of the two input signals.

18. The IC according to claim 17, wherein the impedance devices comprise resistors.

19. The IC according to claim 14, wherein the reference voltage generator comprises one of a long term averager, a resistor voltage divider, and a zener diode reference.

20. The IC according to claim 19, wherein the long term averager comprises one of at least one transistor, at least one operational amplifier, at least one resistive device connected to at least one capacitive device, a low pass filter, a sample and hold circuit, and a track and hold circuit.

21. The IC according to claim 14, wherein the comparator comprises one of an operational amplifier and a differential amplifier.

22. The IC according to claim 14, wherein the storage device receives a clock signal, the comparison signal being stored based on a rising edge of the clock signal.

23. The IC according to claim 22, further comprising a second storage device, the second storage device receiving an inversion of the clock signal, the second storage device storing the comparison signal based on a rising edge of the inverted clock signal, the second stored comparison signal usable by the slew rate controller to adjust one of the rise time and the fall time of one of the two input signals to match one of the fall time and the rise time of the other of the two input signals.

24. The IC according to claim 14, wherein the slew rate controller comprises a pre-driver bias circuit.

25. A system for matching rise time and fall time in two signals comprising:

an scaled summer, the scaled summer receiving two input signals and generating an instantaneous scaled sum signal;

a reference voltage generator, the reference voltage generator receiving the scaled sum signal for generating a reference voltage;

a comparator, the comparator comparing the scaled sum signal and the reference voltage and generating a comparison signal; and an analog holding device, the analog holding device storing the comparison signal based on the two input signals, the stored comparison signal usable by a controller to adjust one of the rise time and the fall time of both of the two input signals to match one of the fall time and the rise time of the two input signals.

26. The system according to claim 25, wherein the analog holding device comprises a sample and hold device.

27. The system according to claim 25, wherein the analog holding device comprises a track and hold device.

28. The system according to claim 25, wherein the analog holding device comprises a low pass filter.

* * * * *